United States Patent
Matsuura et al.

(10) Patent No.: US 9,236,414 B2
(45) Date of Patent: Jan. 12, 2016

(54) LIGHT-EMITTING DEVICE

(71) Applicant: TOYODA GOSEI CO., LTD., Kiyosu-shi (JP)

(72) Inventors: Kenichi Matsuura, Kiyosu (JP); Yuhki Ito, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 13/691,577

(22) Filed: Nov. 30, 2012

(65) Prior Publication Data

US 2013/0161659 A1 Jun. 27, 2013

(30) Foreign Application Priority Data

Dec. 26, 2011 (JP) ................. 2011-284431

(51) Int. Cl.
| | |
|---|---|
| *H01L 27/15* | (2006.01) |
| *H01L 25/075* | (2006.01) |
| *H01L 33/50* | (2010.01) |

(52) U.S. Cl.
CPC ............ *H01L 27/15* (2013.01); *H01L 25/0753* (2013.01); *H01L 33/50* (2013.01)

(58) Field of Classification Search
CPC .................................................. H01L 33/504
USPC ........................................... 257/79, 98
See application file for complete search history.

(56) References Cited

U.S. PATENT DOCUMENTS

| | | | | |
|---|---|---|---|---|
| 6,943,379 | B2 * | 9/2005 | Suehiro et al. | 257/99 |
| 7,696,522 | B2 * | 4/2010 | Ono et al. | 257/88 |
| 2004/0061433 | A1 | 4/2004 | Izuno et al. | |
| 2004/0072383 | A1 | 4/2004 | Nagahama et al. | |
| 2005/0110036 | A1 * | 5/2005 | Park et al. | 257/99 |
| 2006/0128118 | A1 | 6/2006 | Nagahama et al. | |
| 2006/0267042 | A1 | 11/2006 | Izuno et al. | |
| 2007/0194333 | A1 * | 8/2007 | Son | 257/88 |
| 2008/0296609 | A1 | 12/2008 | Nagahama et al. | |
| 2010/0244731 | A1 | 9/2010 | Kaihotsu et al. | |
| 2010/0320928 | A1 | 12/2010 | Kaihotsu et al. | |
| 2011/0291114 | A1 | 12/2011 | Cheng | |
| 2012/0146077 | A1 * | 6/2012 | Nakatsu et al. | 257/98 |
| 2013/0009564 | A1 | 1/2013 | Kaihotsu et al. | |

FOREIGN PATENT DOCUMENTS

| | | | |
|---|---|---|---|
| JP | 2002-170999 A | | 6/2002 |
| JP | 2002-261325 A | | 9/2002 |
| JP | 2007-027310 | * | 1/2006 |
| JP | 2009-088299 A | | 4/2009 |

(Continued)

OTHER PUBLICATIONS

Korean Office Action dated Dec. 18, 213 with English translation thereof.

(Continued)

*Primary Examiner* — Matthew Reames
(74) *Attorney, Agent, or Firm* — McGinn IP Law Group, PLLC.

(57) ABSTRACT

A light-emitting device includes a substrate, and a plurality of light-emitting elements that are mounted on the substrate and each include an LED chip and a phosphor layer on a surface thereof. A maximum deviation in a value of a chromaticity coordinate x of light emitted from the plurality of light-emitting elements is not less than 0.0125.

20 Claims, 1 Drawing Sheet

(56) References Cited

FOREIGN PATENT DOCUMENTS

| JP | 2011-040366 A | | 2/2011 |
|---|---|---|---|
| JP | 2011-249751 A | | 12/2011 |
| KR | 10-2011-0073114 A | * | 6/2011 |
| WO | WO 03/034508 A1 | | 4/2003 |
| WO | WO 2009/101718 A1 | | 8/2009 |

OTHER PUBLICATIONS

Japanese Office Action dated Apr. 15, 2014 with a partial English translation.
Japanese Pre-Appeal Report dated May 20, 2015 with English translation.
Japanese Office Action dated Aug. 12, 2014 with a partial English translation.

* cited by examiner

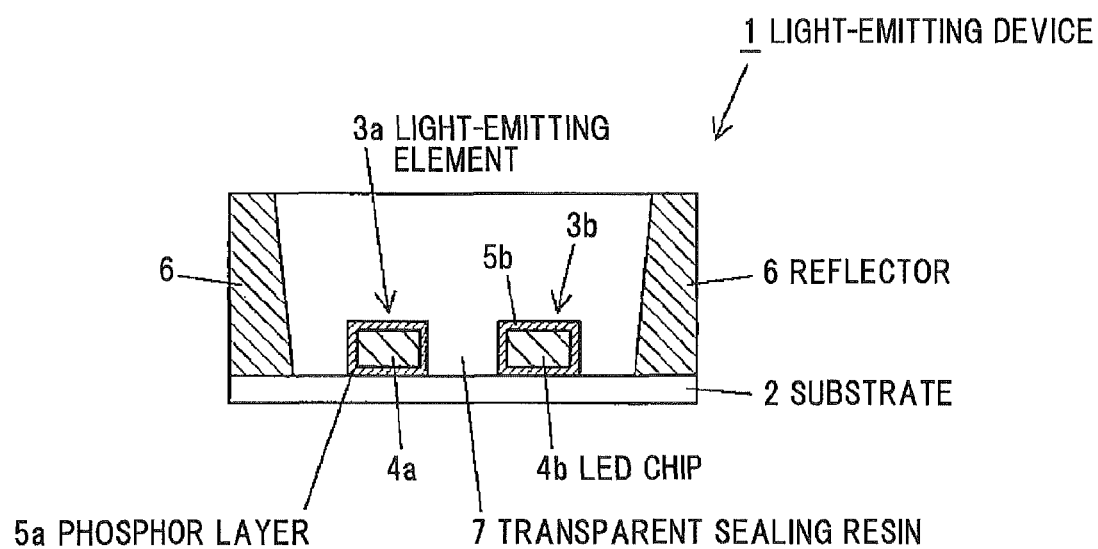

LIGHT-EMITTING DEVICE

The present application is based on Japanese patent application No. 2011-284431 filed on Dec. 26, 2011, the entire contents of which are incorporated herein by reference.

BACKGROUND OF THE INVENTION

1. Field of the Invention

The invention relates to a light-emitting device.

2. Related Art

A light-emitting element composed of an LED chip and a phosphor layer on a surface thereof is known (see, e.g., JP-A-2002-261325 and WO2003/034508). This type of light-emitting element has high light conversion efficiency since the phosphor layer is adjacent to the LED chip. In addition, color unevenness due to a viewing angle can be suppressed by forming the phosphor layer with a uniform thickness.

SUMMARY OF THE INVENTION

However, it is difficult to control the thickness of the phosphor layer on the LED chip and, in many cases, each individual light-emitting element emits light having different chromaticity. Light-emitting elements with a chromaticity out of the product standard are generally discarded as a defective product, which decreases a yield of the light-emitting element.

Accordingly, it is an object of the invention to provide a light-emitting device that includes a light-emitting element comprised of an LED chip and a phosphor layer on a surface thereof and can improve the production yield of the light-emitting element.

(1) According to one embodiment of the invention, a light-emitting device comprises:

a substrate; and a plurality of light-emitting elements that are mounted on the substrate and each comprise an LED chip and a phosphor layer on a surface thereof, wherein a maximum deviation in a value of a chromaticity coordinate x of light emitted from the plurality of light-emitting elements is not less than 0.0125.

In the above embodiment (1) of the invention, the following modifications and changes can be made.

(i) The maximum deviation in the value of the chromaticity coordinate x is not more than 0.1000.

(ii) The maximum deviation in the value of the chromaticity coordinate x is not less than 0.0250.

(iii) The maximum deviation in the value of the chromaticity coordinate x is not less than 0.0375.

EFFECTS OF THE INVENTION

According to one embodiment of the invention, a light-emitting device can be provided that includes a light-emitting element comprised of an LED chip and a phosphor layer on a surface thereof and can improve the production yield of the light-emitting element.

BRIEF DESCRIPTION OF THE DRAWINGS

Next, the present invention will be explained in more detail in conjunction with appended drawings, wherein:

FIG. 1 is a vertical cross-sectional view showing a light-emitting device in an embodiment of the present invention.

DESCRIPTION OF THE PREFERRED EMBODIMENTS

Embodiment

FIG. 1 is a vertical cross-sectional view showing a light-emitting device 1 in an embodiment of the invention. The light-emitting device 1 has a substrate 2, light-emitting elements 3a and 3b mounted on the substrate 2, a reflector 6 formed on the substrate 2 so as to surround or sandwich the light-emitting elements 3a and 3b, and a transparent sealing resin 7 filled inside the reflector 6 on the substrate 2 so as to cover the light-emitting elements 3a and 3b.

The light-emitting elements 3a and 3b are composed of an LED chip 4a and 4b, respectively, with a phosphor layer 5a and 5b, respectively, on a surface thereof.

The LED chips 4a and 4b have, e.g., a square planar shape. The LED chips 4a and 4b emit, e.g., blue light.

The phosphor layers 5a and 5b are formed of a transparent resin film containing a particulate phosphor. The phosphor layers 5a and 5b has a thickness of, e.g., 0.5 mm. The phosphor layers 5a and 5b may contain several types of phosphors which produce fluorescence with different wavelengths.

The transparent resin film constituting the phosphor layers 5a and 5b is formed of a thermoplastic resin such as PET (polyethylene terephthalate), PC (polycarbonate), acrylic or ETFE (ethylene tetrafluoroethylene copolymer), or a thermosetting resin such as silicone resin or epoxy resin.

A portion of light emitted from the LED chips 4a and 4b exits to the outside through the phosphor layers 5a and 5b, and another portion excites an electron in the phosphor in the phosphor layers 5a and 5b. The phosphor with the excited electron produces fluorescence with a wavelength corresponding to a magnitude of band gap.

Each emission color of the light-emitting elements 3a and 3b is a mixture of a color of the light emitted from the LED chip 4a or 4b and exiting to the outside through the phosphor layer 5a or 5b and a color of the fluorescence produced by the phosphor layer 5a or 5b.

Although the phosphor layers 5a and 5b in FIG. 1 are each formed to cover the entire surface of the LED chip 4a or 4b, the arrangement of the phosphor layers 5a and 5b is not limited thereto and the phosphor layers 5a and 5b may be formed only on, e.g., upper surfaces (the upper side in FIG. 1) of the LED chips 4a and 4b.

The substrate 2 is, e.g., a ceramic substrate formed of alumina or aluminum nitride. The substrate 2 has a non-illustrated wiring on a surface or inside thereof. The light-emitting elements 3a and 3b are connected in series by the wiring and voltage is applied through the wiring. Alternatively, a resin composite lead frame having a desired pattern in which a resin is filled between the patterns may be used instead of the substrate 2.

The reflector 6 is formed of, e.g., a white resin and reflects the light emitted from the light-emitting elements 3a and 3b such that directivity is imparted to light emitted from the light-emitting device 1.

The transparent sealing resin 7 is formed of a transparent resin such as silicone resin or epoxy resin.

Followings are combinations of an emission color of the LED chips 4a and 4b and emission colors of the phosphor layers 5a and 5b when the emission color of the light-emitting device 1 is white. When the emission color of the LED chips 4a and 4b is blue and that of the phosphor layers 5a and 5b is yellow, bluish white light is obtained. When the emission color of the LED chips 4a and 4b is blue and the emission colors of the phosphor layers 5a and 5b are green and red, white light close to the color of sunlight is obtained. When the emission color of the LED chips 4a and 4b is blue and the emission colors of the phosphor layers 5a and 5b are yellow and red, reddish-white light close to a color of an incandescent lamp is obtained.

In addition, when the LED chips 4a and 4b emit ultraviolet light and the emission colors of the phosphor layers 5a and 5b are blue and yellow, bluish white light is obtained. When the LED chips 4a and 4b emit ultraviolet light and the emission colors of the phosphor layers 5a and 5b are blue, green and red, white light close to the color of sunlight is obtained. When the LED chips 4a and 4b emit ultraviolet light and the emission colors of the phosphor layers 5a and 5b are blue, yellow and red, reddish-white light close to a color of an incandescent lamp is obtained.

When the phosphor layers 5a and 5b emit lights with several different colors, the phosphor layers 5a and 5b may include multiple transparent resin films each of which contains a different phosphor. When the emission colors of the phosphor layers 5a and 5b are, e.g., red and yellow, one transparent resin film may contain a phosphor emitting red light and a phosphor emitting yellow light, or alternatively, a transparent resin film containing a phosphor emitting red light and that containing a phosphor emitting yellow light may be laminated.

When the phosphor layers 5a and 5b include multiple transparent resin films, it is preferable that a transparent resin film containing a phosphor emitting light having a long wavelength be a lower layer to prevent light emitted from a phosphor in a lower transparent resin film from being absorbed by a phosphor in an upper transparent resin film.

In addition, the transparent sealing resin 7 may contain a phosphor. In this case, the emission color of the phosphor in the phosphor layers 5a and 5b and the emission color of the phosphor in the transparent sealing resin 7 may be either the same or different.

Meanwhile, a maximum deviation of an x chromaticity coordinate of light emitted from the light-emitting elements 3a and 3b is not less than 0.0125. Here, the deviation means a difference between the average value and each individual value. In a conventional manufacturing process of light-emitting device, light-emitting elements which satisfy such a condition are generally discarded as defective products which have chromaticity out of the product standard.

When the maximum deviation of the x chromaticity coordinate of the light emitted from the light-emitting elements 3a and 3b is not less than 0.0125, and in the case that each of the light-emitting elements 3a and 3b is individually mounted in a package, a difference in color may occur between the two packages. However, by using a combination of the light-emitting elements 3a and 3b in one package as is in the present embodiment, it is possible to obtain the light-emitting device 1 which emits light having a desired chromaticity.

More preferably, the maximum deviation of the x chromaticity coordinate of the light emitted from the light-emitting elements 3a and 3b is not less than 0.0250. In this case, when each of the light-emitting elements 3a and 3b is individually mounted in a package, a difference in color is likely to occur between the two packages. However, by using a combination of the light-emitting elements 3a and 3b in one package as is in the present embodiment, it is possible to obtain the light-emitting device 1 which emits light having a desired chromaticity.

Still more preferably, the maximum deviation of the x chromaticity coordinate of the light emitted from the light-emitting elements 3a and 3b is not less than 0.0375. In this case, when each of the light-emitting elements 3a and 3b is individually mounted in a package, a significant difference in color occurs between the two packages. However, by using a combination of the light-emitting elements 3a and 3b in one package as is in the present embodiment, it is possible to obtain the light-emitting device 1 which emits light having a desired chromaticity.

If the maximum deviation of the x chromaticity coordinate of the light emitted from the light-emitting elements 3a and 3b is too large, an emission spectrum width of the light-emitting device 1 is broadened and color unevenness occurs in the outgoing light, hence, not more than 0.1000 is preferable.

The manufacturing of the light-emitting device 1 emitting light (white light) of which x chromaticity coordinate is 0.2800 will be described below as an example.

The respective values of the x chromaticity coordinate of the light emitted from the light-emitting elements 3a and 3b are, e.g., 0.2300 and 0.3300, and 0.2800 as the average thereof is the x chromaticity coordinate of the light emitted from the light-emitting device 1. In this case, the average value of the x chromaticity coordinate of the light emitted from the light-emitting elements 3a and 3b is 0.2800 and the maximum deviation is 0.050.

Alternatively, the light-emitting device 1 may include three or more light-emitting elements, and in this case, the maximum deviation of the x chromaticity coordinate of the light emitted from the light-emitting elements satisfies the above conditions. In this case, at least one of the light-emitting elements is a non-standard product which would be conventionally discarded as a defective product.

Effects of the Embodiment

In the embodiment, LED chips having chromaticity out of the product standard which would be conventionally discarded are combined under appropriate conditions, which allows a light-emitting device emitting light having a desired chromaticity to be obtained. Therefore, a yield of a light-emitting element which has an LED chip and a phosphor layer on a surface thereof and by which a difference in chromaticity is likely to occur between individual light-emitting elements due to difficulty of controlling a thickness of the phosphor layer can be improved.

In addition, since it is possible to form the phosphor layer on the surface of the LED chip before mounting the LED chip on the substrate, it is possible to test chromaticity of light emitted from the light-emitting element before mounting the LED chip on the substrate. Therefore, when forming the light-emitting device, the light-emitting elements can be mounted on the substrate after determining an appropriate combination thereof.

It should be noted that the present invention is not intended to be limited to the above-mentioned embodiment, and the various kinds of modifications can be implemented without departing from the gist of the invention.

In addition, the invention according to claims is not to be limited to the above-mentioned embodiment. Further, it should be noted that all combinations of the features described in the embodiment are not necessary to solve the problem of the invention.

What is claimed is:

1. A light-emitting device, comprising:
a package comprising a single concave portion;
a plurality of light-emitting elements that are mounted inside the single concave portion of the package, each of the light-emitting elements comprising an LED (Light Emitting Diode) chip that emits light and a phosphor layer on a surface thereof, the plurality of light-emitting elements comprising a first light-emitting element and at least a second light-emitting element;

a sealing material filled in the single concave portion; and a reflector disposed on the package to reflect the light emitted from the plurality of light-emitting elements, in a cross-sectional view, the single concave portion extending between adjacent side surfaces of the reflector such that, in the cross-sectional view, said each of the light-emitting elements is disposed between said adjacent side surfaces of the reflector, wherein a maximum deviation in a value of a chromaticity coordinate x of light emitted from the plurality of light-emitting elements is not less than 0.0125, such that a mean value of a chromaticity coordinate x of light emitted from the first light-emitting element is greater than a mean value of the chromaticity coordinate x of the light emitted from the plurality of light-emitting elements not less than 0.0125, and a mean value of a chromaticity coordinate x of light emitted from the at least second light-emitting element is less than the mean value of the chromaticity coordinate x of the light emitted from the plurality of light-emitting elements not less than 0.05 V.

2. The light-emitting device according to claim 1, wherein the maximum deviation in the value of the chromaticity coordinate x is not more than 0.1000.

3. The light-emitting device according to claim 1, wherein the maximum deviation in the value of the chromaticity coordinate x is not less than 0.0250.

4. The light-emitting device according to claim 1, wherein the maximum deviation in the value of the chromaticity coordinate x is not less than 0.0375.

5. The light-emitting device according to claim 3, wherein the maximum deviation in the value of the chromaticity coordinate x is not more than 0.1000.

6. The light-emitting device according to claim 4, wherein the maximum deviation in the value of the chromaticity coordinate x is not more than 0.1000.

7. The light-emitting device according to claim 1, wherein the maximum deviation in the value of the chromaticity coordinate x is defined as a difference between an average value of the chromaticity coordinate x of the light emitted from the plurality of light-emitting elements and a value of the chromaticity coordinate x of light emitted from one of the plurality of light-emitting elements.

8. The light-emitting device according to claim 1, wherein the light-emitting device comprises a combination of the light-emitting elements in the package.

9. The light-emitting device according to claim 1, wherein, in the cross-sectional view, the side surfaces of the reflector sandwich the plurality of light-emitting elements.

10. The light-emitting device according to claim 9, wherein the sealing material comprises a transparent resin filling an area between the side surfaces of the reflector on the package, the transparent resin being disposed on the side surfaces of the reflector.

11. The light-emitting device according to claim 10, wherein, in said each of the light-emitting elements, said phosphor layer includes side surfaces and upper surfaces disposed with the transparent resin.

12. The light-emitting device according to claim 1, wherein said phosphor layer is disposed on a bottom surface of the LED chip of said each of the light-emitting elements.

13. The light-emitting device according to claim 1, wherein said phosphor layer abuts a bottom surface of the LED chip of said each of the light-emitting elements.

14. The light-emitting device according to claim 1, wherein said phosphor layer comprises a transparent resin film comprising a particulate phosphor.

15. The light-emitting device according to claim 1, wherein said phosphor layer comprises a plurality of phosphors which produce different wavelengths.

16. The light-emitting device according to claim 1, wherein, in said each of the light-emitting elements, said phosphor layer covers each surface of the LED chip.

17. The light-emitting device according to claim 1, wherein said phosphor layer comprises a plurality of transparent resin films each including a different phosphor.

18. The light-emitting device according to claim 1, wherein, in said each of the light-emitting elements, said phosphor layer is disposed on side surfaces of the LED chip.

19. The light-emitting device according to claim 1, wherein, in said each of the light-emitting elements, said LED chip comprises a light-emitting diode.

20. The light-emitting device according to claim 1, wherein, in the cross-sectional view, the sealing material continuously extends above upper surfaces of the light-emitting elements and between said adjacent side surfaces of the reflector.

* * * * *